United States Patent
Kodama

(10) Patent No.: US 9,142,301 B2
(45) Date of Patent: *Sep. 22, 2015

(54) DATA WRITING METHOD AND SYSTEM

(71) Applicant: Spansion LLC, Sunnyvale, CA (US)

(72) Inventor: Tetsuhiro Kodama, Kanagawa (JP)

(73) Assignee: Cypress Semiconductor Corporation, San Jose, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/149,484

(22) Filed: Jan. 7, 2014

(65) Prior Publication Data

US 2014/0122785 A1   May 1, 2014

Related U.S. Application Data

(63) Continuation of application No. 13/070,186, filed on Mar. 23, 2011, now Pat. No. 8,635,397.

(30) Foreign Application Priority Data

Apr. 19, 2010  (JP) .................................. 2010-096089

(51) Int. Cl.
    *G11C 16/10*   (2006.01)
    *G06F 11/10*   (2006.01)
    *G06F 12/02*   (2006.01)

(52) U.S. Cl.
    CPC ............. *G11C 16/10* (2013.01); *G06F 11/1068* (2013.01); *G06F 12/0246* (2013.01)

(58) Field of Classification Search
    CPC .. G11C 16/10; G06F 11/1068; G06F 12/0246
    See application file for complete search history.

(56) References Cited

U.S. PATENT DOCUMENTS

| 4,638,457 | A | * | 1/1987 | Schrenk ................... 365/189.16 |
| 5,941,993 | A | * | 8/1999 | Tanaka et al. ................ 714/6.12 |
| 5,983,312 | A | * | 11/1999 | Komatsu et al. ............... 711/103 |
| 6,125,424 | A | * | 9/2000 | Komatsu et al. ............... 711/103 |

(Continued)

FOREIGN PATENT DOCUMENTS

| JP | 6-5094 A | 1/1994 |
| JP | 8-137744 A | 5/1996 |

(Continued)

OTHER PUBLICATIONS

Office Action mailed Oct. 11, 2013 in Japanese application No. 2010-096089.

(Continued)

*Primary Examiner* — Joseph D Torres

(57) ABSTRACT

A data writing method for writing data to a flash memory includes writing an initial value to the data storage area, determining whether or not the writing of the initial value is performed normally based on a write flag, writing data to the data storage area when the writing is performed normally, and erasing a block including the data storage area when the writing is not performed normally. An initial value is written to the data storage area before writing data, so that whether or not an error correction code storage area contains the initial value may be confirmed. An erase operation of the block is performed only when the error correction code storage area does not contain the initial value, so that the number of times of erasure of the block may be reduced and the life of the product may be increased.

17 Claims, 5 Drawing Sheets

(56) References Cited

U.S. PATENT DOCUMENTS

| | | | | |
|---|---|---|---|---|
| 6,161,163 | A * | 12/2000 | Komatsu et al. | 711/103 |
| 6,584,579 | B1 * | 6/2003 | Komatsu et al. | 714/6.32 |
| 6,766,409 | B2 * | 7/2004 | Komatsu et al. | 711/103 |
| 7,073,015 | B2 * | 7/2006 | Takai | 711/103 |
| 7,188,210 | B2 * | 3/2007 | Komatsu et al. | 711/103 |
| 7,257,666 | B2 * | 8/2007 | Komatsu et al. | 711/103 |
| 7,404,030 | B2 * | 7/2008 | Takai | 711/103 |
| 7,405,976 | B2 * | 7/2008 | Hebishima | 365/185.22 |
| 7,480,760 | B2 * | 1/2009 | Bernstein et al. | 711/103 |
| 2003/0196029 | A1 * | 10/2003 | Komatsu et al. | 711/103 |
| 2004/0168013 | A1 * | 8/2004 | Komatsu et al. | 711/103 |
| 2004/0168017 | A1 * | 8/2004 | Hayashi | 711/103 |
| 2008/0239823 | A1 * | 10/2008 | Hebishima | 365/185.18 |
| 2010/0083073 | A1 * | 4/2010 | Terauchi | 714/763 |
| 2011/0167208 | A1 * | 7/2011 | So et al. | 711/103 |

FOREIGN PATENT DOCUMENTS

| | | |
|---|---|---|
| JP | 10-134586 A | 5/1998 |
| JP | 2002-108722 A | 4/2002 |
| JP | 2005-141418 A | 6/2005 |
| JP | 2006-79528 A | 3/2006 |
| JP | 2008-293555 A | 12/2008 |

OTHER PUBLICATIONS

Notice of Allowance mailed Sep. 16, 2013 in U.S. Appl. No. 13/070,186.

* cited by examiner

DATA WRITING METHOD AND SYSTEM

CROSS-REFERENCE TO RELATED APPLICATION

This application is a continuation of U.S. application Ser. No. 13/070,186, filed Mar. 23, 2011, now U.S. Pat. No. 8,635,397, issued Jan. 21, 2014, which claims priority to Japan Patent Application Number 2010-096089, filed Apr. 19, 2010, both of which are incorporated by reference herein in their entirety.

FIELD

The present embodiments relate to a method for writing data to a flash memory and a system with the flash memory.

BACKGROUND

In a nonvolatile semiconductor memory, such as a flash memory, an error correction code is stored along with data, so that the reliability of data may be improved. The reliability of data may be further improved if the data of a block, in which an error has been corrected, is rewritten to other block. A related art is discussed in Japanese Laid-open Patent Publication No. 2002-108722.

The error correction code is automatically generated by a memory control circuit or the like based on write data. For this reason, a data processing unit which writes data to a flash memory may not directly read the error correction code. Usually, in the flash memory, it is not possible to perform the rewriting from the logic "0" indicative of the write state to the logic "1" indicative of the erase state. For this reason, for example, when there is a bit with the logic "0" in an error correction code storage area, in a state of a data storage area being erased, an error correction code generated based on write data may not be correctly written to the error correction code storage area. At this time, it is not possible to determine whether this is a problem due to the life of the flash memory or a problem due to the fact that the error correction code storage area has not been erased. In order to prevent this problem, an erase operation needs to be performed every time before initially writing data for each block which is the unit of erasure. This increases the number of times of erasure and shortens the life of the product.

SUMMARY

According to an aspect of the embodiments, a data writing method for writing data to a flash memory including a data storage area and an error correction code storage area, the method includes writing an initial value to the data storage area, determining whether or not the writing of the initial value is performed normally based on a write flag, writing data to the data storage area when the writing is performed normally, and erasing a block including the data storage area when the writing is not performed normally.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Hereinafter, embodiments will be described by using the accompanying drawings.

Figure 1:
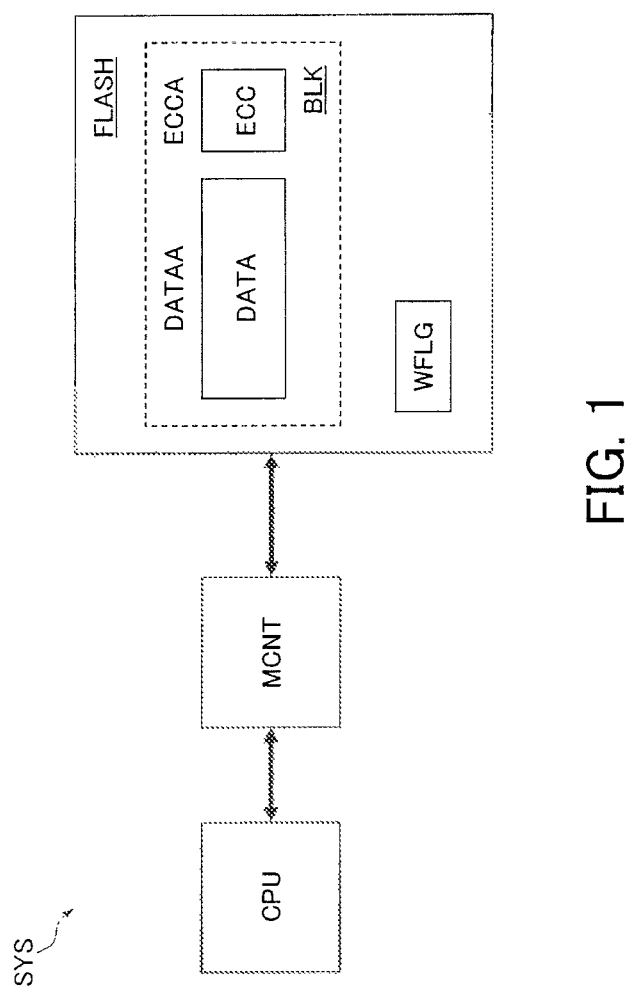
FIG. 1 illustrates an example of a system in one embodiment.

FIG. 1 illustrates an example of a system SYS in one embodiment. The system SYS (user system) forms at least a part of a microcomputer system, for example, such as portable equipment.

For example, the system SYS includes a CPU (Central Processing Unit), a flash memory control circuit MCNT, and a nonvolatile semiconductor memory, such as a flash memory FLASH. The CPU operates by executing a program stored in a ROM contained in the system SYS, for example, and controls the flash memory control circuit MCNT in order to read or write data with respect to the flash memory FLASH or erase the data held in the flash memory FLASH. Based on an instruction from the CPU, the flash memory control circuit MCNT controls the flash memory FLASH in order to execute the read operation, write operation, and erase operation of the flash memory FLASH.

The flash memory FLASH includes at least one block BLK including a data storage area DATAA and an error correction code storage area ECCA, and a write flag WFLG. For example, the write flag WFLG is formed by a latch circuit. The data storage area DATAA holds data DATA supplied from the CPU. The error correction code storage area ECCA holds an error correction code ECC for correcting an error of the data written to the data storage area DATAA. The error correction code ECC is generated by the flash memory control circuit MCNT based on the data DATA supplied from the CPU. Note that a plurality of sets of the data storage area DATAA and error correction code storage area ECCA may be formed in the block BLK. Moreover, a plurality of blocks BLK may be formed. For example, the block BLK is a unit to execute the erase operation. The write flag WFLG holds information on whether or not the data DATA and error correction code ECC have been normally written to the data storage area DATAA and error correction code storage area ECCA, respectively, in the write operation.

For example, the data storage area DATAA and error correction code storage area ECCA have 32 bits and 7 bits, respectively. Note that the error correction code storage area ECCA may be formed by 8 bits including a one-bit unused area, and the data DATA and error correction code ECC may be stored by using 40 bits (5 bytes). For example, the data storage area DATAA and error correction code storage area ECCA are formed by a plurality of memory cells, respectively, each having a memory transistor including a floating gate. For this reason, the data DATA and error correction code ECC written to the data storage area DATAA and error correction code storage area ECCA, respectively, are held without being lost even when the power supply is not supplied to the flash memory FLASH.

For example, the data storage area DATAA and error correction code storage area ECCA indicate the logic "1" in the erase state, and are changed to the logic "0" by the write operation. The data storage area DATAA and error correction code storage area ECCA which have been set to the logic "0" may not be changed to the logic "1" in the unit of bit. At this time, the data held in the data storage area DATAA and error correction code storage area ECCA needs to be collectively erased to be changed to the logic "1" in the unit of block BLK.

Upon receipt of a write operation instruction from the CPU, the flash memory control circuit MCNT generates the error correction code ECC corresponding to the write data DATA, and writes the write data DATA and error correction code ECC to the flash memory FLASH. The write operation is an operation to change a predetermined bit in the data storage area DATAA and error correction code storage area ECCA, respectively, from the logic "1" to the logic "0". When the write data DATA and error correction code ECC have been normally written to the data storage area DATAA and error correction code storage area ECCA, respectively, the flash memory FLASH sets the write flag WFLG to a value indicative of normality. When the write data DATA and error correction code ECC have not been written to the data storage area DATAA and error correction code storage area ECCA, respectively, the flash memory FLASH sets the write flag WFLG to a value indicative of abnormality.

Whether or not the write operation was able to be normally performed is determined, for example, by a verification operation which is automatically performed in the flash memory FLASH during the write operation. In the write operation, a program operation to program a memory cell to the logic "0" and a verification operation to confirm that the memory cell has been set to the logic "0" are sequentially performed. After the program operation and verification operation are performed a predetermined number of times (at least once), when the logic "0" may not be confirmed in the last verification operation, abnormal writing is detected. For example, the abnormal writing occurs when the logic "1" is attempted to be written to a bit currently set to the logic "0" in the data storage area DATAA or error correction code storage area ECCA. At this time, the write flag WFLG is set to a value indicative of abnormality.

Upon receipt of a read operation instruction from the CPU, the flash memory control circuit MCNT reads the data DATA from the data storage area DATAA and outputs the read data DATA to the CPU. The flash memory control circuit MCNT, when detecting that the read data DATA has an error, corrects the error by using the error correction code ECC, which has been read along with the data DATA, and outputs the corrected data DATA to the CPU. Note that the CPU may not access the error correction code storage area ECCA and therefore may not read the error correction code ECC.

Upon receipt of an erase operation instruction from the CPU, the flash memory control circuit MCNT causes the flash memory FLASH to execute the erase operation. In the erase operation, all the values currently held in the data storage area DATAA and error correction code storage area ECCA in the block BLK, which is instructed to be erased, are set to the logic "1".

Upon receipt of the first write operation instruction from the CPU after the erase operation, the flash memory control circuit MCNT writes an initial value to the data storage area DATAA before writing the data DATA. For example, the initial value is a value indicating that all the bits in the data storage area DATAA are the logic "1" (a value indicative of the erase state). For this reason, the data held in the data storage area DATAA and error correction code storage area ECCA, in the erase state does not change by the writing of the logic "1".

Upon receipt of the initial value in the write operation, the flash memory FLASH confirms that all the bits of the data DATA held in the data storage area DATAA and the error correction code ECC held in the error correction code storage area ECCA are the logic "1". Then, the flash memory FLASH sets the write flag WFLG to a value indicative of normality. In other words, when the write flag WFLG indicates normality, it is confirmed that the erase state of the error correction code storage area ECCA is normal. The flash memory control circuit MCNT recognizes that the write result of the initial value is normal by reading the value of the write flag WFLG, and writes the data DATA received from the CPU to the flash memory FLASH.

Meanwhile, when the flash memory FLASH receives the initial value in the write operation and it is confirmed that at least one bit of the data DATA and error correction code ECC is the logic "0", the flash memory FLASH sets the write flag WFLG to a value indicative of abnormality. For example, when the power supply supplied to the flash memory FLASH is turned off during the erase operation, some of the bits in the error correction code storage area ECCA may not be set to the logic "1". If the error correction code ECC is written to the error correction code storage area ECCA containing the logic "0", the right error correction code ECC may not be written.

For example, if binary "101 0101" is written to the error correction code storage area ECCA in which binary "111 1110" is currently set, the logic "1" is attempted to be written to the 7th bit (the right end bit) having the logic "0". At this time, due to the abnormal writing, the value indicative of abnormality is written to the write flag WFLG. However, the flash memory control circuit MCNT may not determine whether this abnormality is due to the fact that the corresponding data has not been correctly erased or due to the life of the flash memory FLASH. Here, the life of the flash memory FLASH is a hardware failure which occurs when the number of times of erasure exceeds an upper limit.

The flash memory control circuit MCNT may recognize that the result of writing the initial value is abnormal by reading the write flag WFLG after writing the initial value. This makes it possible to confirm that the error correction code storage area ECCA is not in the erase state. In other words, it is possible to identify that the cause of the abnormalities is not due to the life of the product. Subsequently, the flash memory control circuit MCNT executes the erase operation of the block BLK, whose initial value is instructed to be written, in order to set the error correction code storage area ECCA to the erase state. After the erase operation, the flash memory control circuit MCNT writes the data DATA received from the CPU to the block BLK.

As described above, in this embodiment, the initial value is written to the data storage area DATAA before writing the data DATA, so that whether or not the error correction code storage area ECCA contains the initial value may be checked. The erase operation of the block BLK is performed only when the error correction code storage area ECCA does not contain the initial value, so that the number of times of erasure of the block BLK may be reduced and the life of the product may be increased.

Meanwhile, although, in FIG. 1, an example has been shown in which the write flag WFLG is formed in the flash memory FLASH, the write flag WFLG may be formed in the flash memory control circuit MCNT. At this time, in the write operation, the flash memory control circuit MCNT reads the data DATA and the error correction code ECC held in the error correction code storage area ECCA. Then, the flash memory control circuit MCNT determines whether or not the write operation has been normally completed.

Moreover, the CPU may have the function of the flash memory control circuit MCNT. In this case, an instruction to write the initial value to the flash memory FLASH, an instruction to confirm the write flag WFLG, and an instruction to perform the erase operation after writing the initial value are performed by the CPU.

Figure 2:
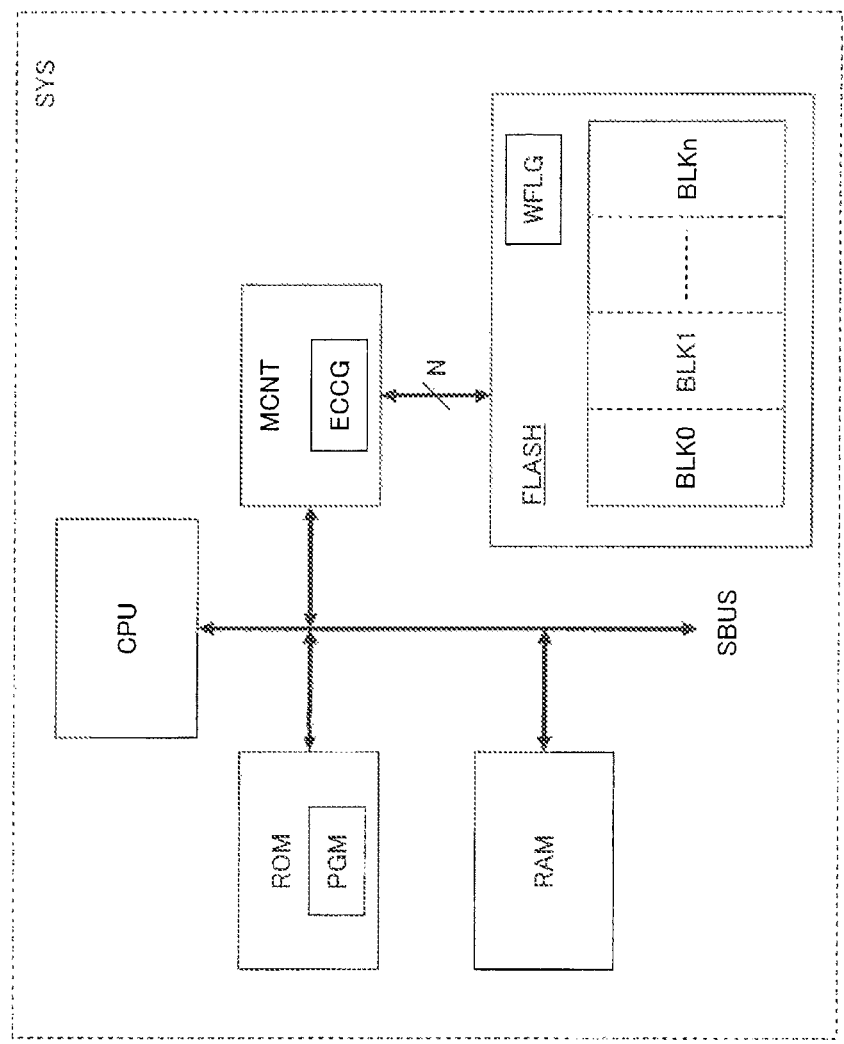
FIG. 2 illustrates an example of a system in an alternative embodiment.

FIG. 2 illustrates an example of the system SYS in another embodiment. For the same element as the element in the embodiment described above, the same reference numeral is given, and the detailed description thereof is omitted. The system SYS (user system) forms at least a part of a microcomputer system, for example, such as portable equipment. The system SYS may be formed by integrating a plurality of macros on a silicon substrate or may be formed by mounting a plurality of chips on a package board.

For example, the system SYS includes a CPU, a ROM, a RAM, the flash memory control circuit MCNT, and the flash memory FLASH. The CPU, ROM, RAM, and flash memory control circuit MCNT are coupled to each other by a system bus SBUS. The flash memory control circuit MCNT and the flash memory FLASH are coupled to each other by a dedicated bus. For example, the bit width N of data of the dedicated bus is 16 bits. The flash memory control circuit MCNT includes an error correction code generation circuit ECCG which calculates the error correction code ECC for correcting an error of the data read from the flash memory FLASH based on the write data. Note that, the CPU may have the function of the flash memory control circuit MCNT, so that the CPU may directly access the data on the flash memory FLASH without using the flash memory control circuit MCNT.

The CPU accesses the ROM, RAM and accesses the flash memory FLASH via the flash memory control circuit MCNT to control the whole operation of the system. The flash memory FLASH executes the write operation, the read operation, and the erase operation in response to an access request from the flash memory control circuit MCNT which operates according to the instruction from the CPU. For example, the flash memory FLASH includes a plurality of blocks BLK (BLK0, BLK1, . . . , BLKn). For example, in the ROM, a program PGM executed by the CPU and the data used in the program PGM are stored. For example, in the RAM, the data or the like used in the program PGM is temporarily stored. An example of the block BLK is illustrated in FIG. 3.

Figure 3:
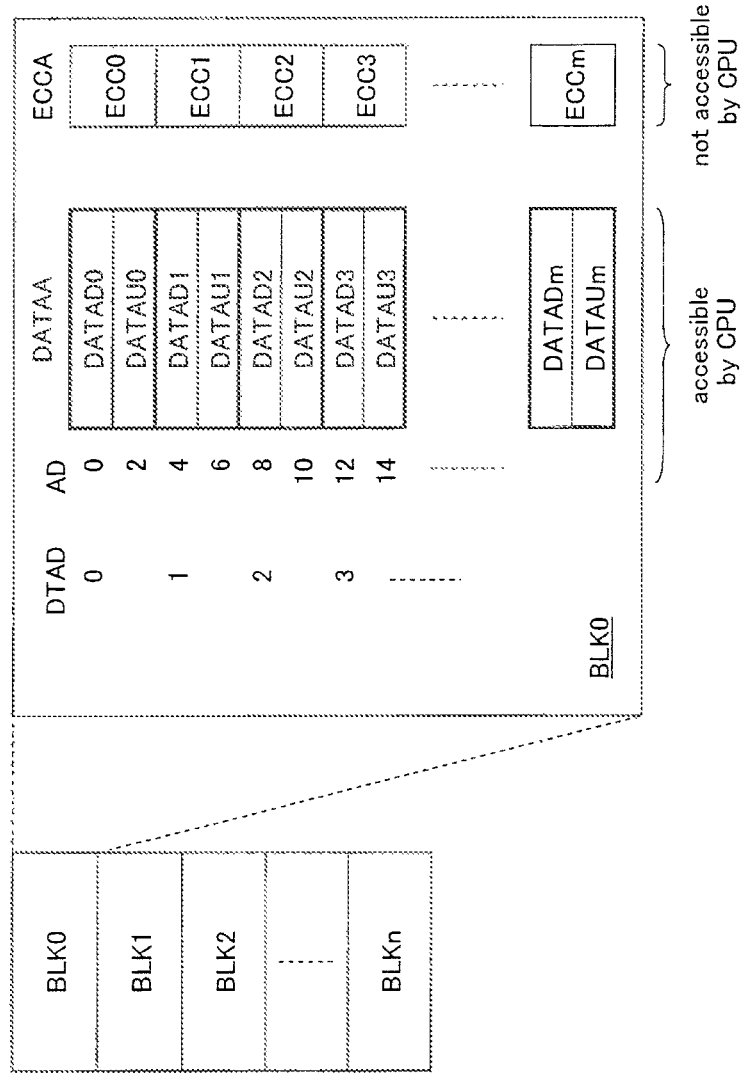
FIG. 3 illustrates an example of the data structure of a block of a flash memory illustrated in FIG. 2.

FIG. 3 illustrates an example of the data structure of the blocks BLK0-BLKn of the flash memory FLASH illustrated in FIG. 2. Because the data structure of each of the blocks BLK0-BLKn is the same, the block BLK0 is described.

The block BLK0 includes a plurality of data storage areas DATAA and a plurality of error correction code storage areas ECCA, respectively, corresponding to the data storage area DATAA. Each data storage area DATAA has a 16-bit wide data area DATAD and a 16 bit-wide DATAU. That is, the bit width of the data storage area DATAA is 32 bits. In the following description, the data DATA stored in the data areas DATAD and DATAU is also referred to as DATAD and DATAU, respectively.

In this example, the data written from the CPU to the flash memory FLASH and the data read from the flash memory FLASH to the CPU have 16 bits, respectively, for example. That is, the CPU inputs or outputs the data DATAD or data DATAU in one write operation or one read operation. Note that the CPU may read the 8-bit, 16-bit, or 32-bit data from the flash memory FLASH via the memory controller MCNT. The address AD of the data storage area DATAA is allocated for each one byte (8 bits). In contrast, the address DTAD, with the 32-bit wide data storage area DATAA as the unit, is allocated for each 4 bytes. That is, one address DTAD is given for the 32-bit wide data storage area DATAA. The number appended to the data areas DATAD and DATAU, respectively, indicates the address DTAD.

The error correction code storage area ECCA is formed corresponding to a pair of data areas DATAD and DATAU. Each error correction code storage area ECCA holds the error correction code ECC (ECC0, ECC1, . . . , ECCm) of the 32-bit data DATAD and DATAU written to the corresponding data areas DATAD and DATAU. As in FIG. 1, the error correction code ECC may not be accessed by the CPU, but may be accessed only by the flash memory control circuit MCNT.

For example, each error correction code storage area ECCA is allocated to the address AD different from that of the data storage area DATAA. Note that each error correction code storage area ECCA may be allocated to the same address AD as that of the data storage area DATAA.

Figure 4:
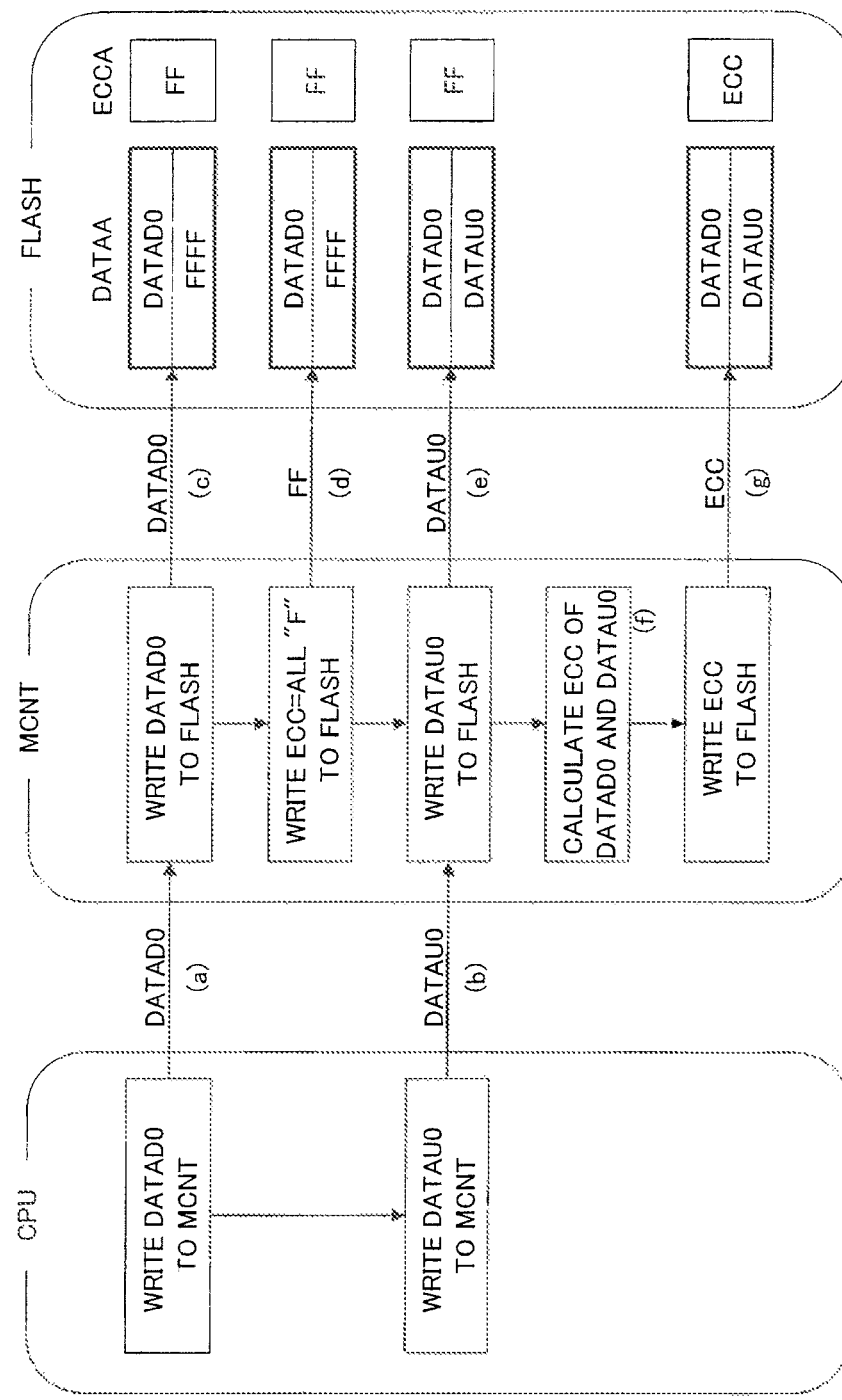
FIG. 4 illustrates an example of a data write operation to the flash memory illustrated in FIG. 2.

FIG. 4 illustrates an example of the data write operation to the flash memory FLASH illustrated in FIG. 2. FIG. 4 illustrates the operation when it is known that all of the data storage area DATAA of the block BLK, to which the data of the flash memory FLASH is written, and the error correction code storage area ECCA are already erased to be changed to the logic "1". The CPU sequentially outputs the 32-bit data DATAD0 and DATAU0 to the flash memory control circuit MCNT in order to write the 32-bit data DATAD0 and DATAU0 to the flash memory FLASH ((a, b) in FIG. 4).

The flash memory control circuit MCNT writes the first 16-bit data DATAD0 supplied from the CPU to the data area DATAD0 of the flash memory FLASH ((c) in FIG. 4). Next, the flash memory control circuit MCNT writes hexadecimal "FF" to the error correction code storage area ECCA corresponding to the data area DATAD0 ((d) in FIG. 4). Next, the flash memory control circuit MCNT writes the next 16-bit data DATAU0 supplied from the CPU to the data area DATAU0 of the flash memory FLASH ((e) in FIG. 4).

Subsequently, the flash memory control circuit MCNT calculates the error correction code ECC of the 32-bit data DATAD0 and DATAU0 supplied from the CPU ((f) in FIG. 4). Next, the flash memory control circuit MCNT writes the calculated error correction code ECC to the error correction code storage area ECCA corresponding to the data area DATAD0 ((g) in FIG. 4). Thus, the writing of the 32-bit data DATAD0 and DATAU0 and error correction code ECC to the flash memory FLASH is completed.

Note that, the flash memory control circuit MCNT, when writing the data DATAD (or DATAU) to the flash memory FLASH, performs the writing of the data DATAD (or DATAU), followed by also performing the write operation on the error correction code storage area ECCA. For this reason, in the writing of the first data DATAD whose error correction code ECC may not be calculated, a dummy (hexadecimal "FF") error correction code ECC is written to the error correction code storage area ECCA. The control of the writing to the flash memory FLASH is patterned in this manner, so that the circuit and operation of the flash memory control circuit MCNT may be simplified.

Figure 5:
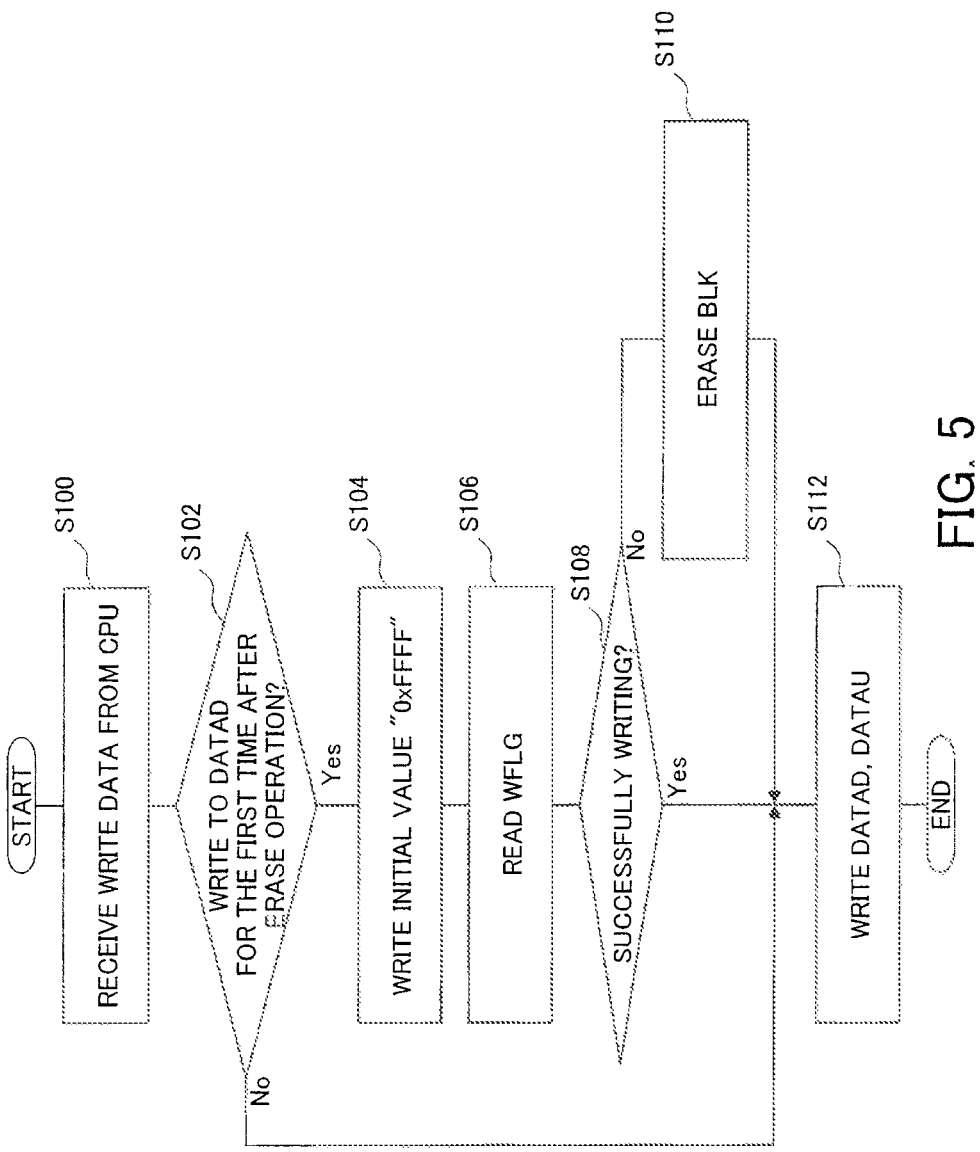
FIG. 5 illustrates an example of the processing performed by a flash memory control circuit in the write operation illustrated in FIG. 4.

FIG. 5 illustrates an example of the processing performed by the flash memory control circuit MCNT in the write operation illustrated in FIG. 4. The processing of FIG. 5 may be realized by using hardware formed in the flash memory control circuit MCNT or may be realized by using a program the flash memory control circuit MCNT executes.

First, in step S100, the flash memory control circuit MCNT receives the write data DATAD from the CPU. Next, in step S102, the flash memory control circuit MCNT determines whether or not the write data DATAD is written for the first time after the erase operation of the corresponding block BLK. When performing the write operation on the data area DATAD for the first time after the erase operation of the block BLK, the processing moves to step S104. When the write operation is already performed after the erase operation of the block BLK, the processing moves to step S112.

For example, whether or not the write operation has already been performed is determined by reading the value of an erasure check flag provided for each block BLK. The erasure check flag is set to the logic "1" after the erase operation of the corresponding block BLK, and is set to the logic "0" when the write operation is performed for the first time after the erase operation of this block BLK. The erasure check flag may be formed in the flash memory control circuit MCNT or may be formed in the flash memory FLASH. The erasure check flag, when formed in the flash memory FLASH, may use one of the memory cells in each block BLK.

In step S104, the flash memory control circuit MCNT writes "0xFFFF" as the initial value to the data area DATAD of the flash memory FLASH. Here, "0x" indicates a hexadecimal number. That is, hexadecimal "FFFF" (16 bits) is written to the data area DATAD. The flash memory FLASH receives an instruction from the flash memory control circuit MCNT, and performs the write operation to write "FFFF" to the data area DATAD. In this case, the flash memory FLASH confirms, in the verification operation, that "FFFF" and "FF" are set in the data area DATAD and error correction code storage area ECCA, respectively.

When the values of the data area DATAD and error correction code storage area ECCA are respectively "FFFF" and "FF", the flash memory FLASH sets the write flag WFLG to the value indicative of normality. When the value of the data area DATAD is not "FFFF" or when the value of the error correction code storage area ECCA is not "FF", the flash memory FLASH sets the write flag WFLG to the value indicative of abnormality. Note that, when the data DATAD and DATAU are stored in a plurality of data storage areas DATAA illustrated in FIG. 3, the initial value "0xFFFF" is written to all the data areas DATAD to be used.

Next, in step S106, the flash memory control circuit MCNT reads the value of the write flag WFLG. In step S108, when the write flag WFLG indicates the normal value, the flash memory control circuit MCNT determines that the writing of the initial value "FFFF" has been successfully performed, and performs the processing in step S112. When the write flag WFLG indicates the abnormal value, the flash memory control circuit MCNT determines that the writing of the initial value "FFFF" has been unsuccessfully performed, and performs the processing in step S110, followed by performing the processing in step S112.

In step S110, the flash memory control circuit MCNT causes the block BLK including the data area DATAD, to which the initial value "FFFF" has been written, to perform the erase operation. Due to the erase operation, all the data storage areas DATAA and all the error correction code storage areas ECCA in the block BLK are set to the logic "1".

In step S112, the flash memory control circuit MCNT performs the processing of the write operation illustrated in FIG. 4. As described above, when the power supply supplied to the flash memory FLASH is turned off during the erase operation, some of the bits in the error correction code storage area ECCA may not be set to the logic "1". The initial value "0xFFFF" is written to the data area DATAD in step S104, so that it is possible to easily confirm that all the bits of the error correction code storage area ECCA are set to the logic "1". Thus, the erase operation of the block BLK may be performed only when the error correction code storage area ECCA is not normal. As a result, the number of times of the erasure of the block BLK may be reduced and the life of the product may be increased.

As described above, also in this embodiment, the same effect as that of the above-described embodiments may be obtained. Note that, when the CPU has the function of the flash memory control circuit MCNT, the processing illustrated in FIG. 5 may be performed by the CPU.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A data writing method for writing data to a flash memory comprising a data storage area and an error correction code storage area, the method comprising:
   writing an initial value to the data storage area;
   setting a write flag based on the writing of the initial value;
   determining, based on the write flag, whether or not the writing of the initial value is performed normally;
   writing data to the data storage area when the writing is performed normally; and
   erasing a block comprising the data storage area when the writing is not performed normally.

2. The data writing method according to claim 1, wherein N-bit wide data is written to the flash memory, N being a positive integer, and one address is given to the data storage area being 2N-bit width.

3. The data writing method according to claim 2, wherein based on data stored in the data storage area being 2N-bit wide, an error correction code to be stored in the error correction code storage area corresponding to the data storage area is calculated.

4. The data writing method according to claim 1, wherein the N-bit wide data is written to the flash memory, N being a positive integer, and the initial value has N bits.

5. The data writing method according to claim 4, wherein the N is 16 and the initial value is hexadecimal FFFF.

6. A system, comprising:
   a CPU:
   a flash memory comprising a data storage area and an error correction code storage area; and
   a flash memory control circuit controlling the flash memory based on an instruction from the CPU, wherein the flash memory control circuit:
   performs writing of an initial value to the data storage area;
   setting a write flag based on the writing of the initial value;
   determines, based on the write flag, whether or not the writing of the initial value is performed normally;
   writes data to the data storage area when the writing is performed normally; and
   erases a block comprising the data storage area when the writing is not performed normally.

7. The system according to claim 6, further comprising a data bus being N-bit wide coupled between the flash memory and the flash memory control circuit, N being a positive integer, wherein the flash memory control circuit writes data to the data storage area corresponding to one address via the data bus more than once.

8. The system according to claim 7, wherein the flash memory control circuit, based on data stored in the data storage area being 2N-bit wide, calculates an error correction code to be stored in the error correction code storage area corresponding to the data storage area.

9. The system according to claim 6, further comprising a data bus being N-bit wide, coupled between the flash memory and the flash memory control circuit, N being a positive integer, wherein the initial value having N bits is written to the data storage area.

10. The system according to claim 9, wherein the N is 16 and the initial value is hexadecimal FFFF.

11. A memory system comprising:
a memory comprising a data storage area and an error correction code storage area; and
a memory controller configured to:
control the memory based on an instruction input to the memory system;
write an initial value to the data storage area;
set a write flag based on the writing of the initial value;
determine, based on the write flag, whether or not the writing of the initial value is performed normally;
write data to the data storage area when the writing is performed normally; and
erase a block comprising the data storage area when the writing is not performed normally.

12. The memory system of claim 11, further comprising:
a data bus being N-bit wide coupled between the memory and the memory controller, N being a positive integer, wherein the memory controller writes data to the data storage area corresponding to one address via the data bus more than once.

13. The memory system of claim 12, wherein the memory controller, based on data stored in the data storage area being 2N-bit wide, calculates an error correction code to be stored in the error correction code storage area corresponding to the data storage area.

14. The memory system of claim 11 further comprising:
a data bus being N-bit wide, coupled between the memory and the memory controller, N being a positive integer, wherein the initial value having N bits is written to the data storage area.

15. The memory system according to claim 14, wherein the N is 16 and the initial value is hexadecimal FFFF.

16. The memory system of claim 11, wherein the memory is a flash memory.

17. The memory system of claim 11, wherein the instruction input to the memory system is from a CPU.

* * * * *